(12) United States Patent
Lee et al.

(10) Patent No.: US 9,467,050 B2
(45) Date of Patent: Oct. 11, 2016

(54) SEMICONDUCTOR APPARATUS HAVING TRANSFER CIRCUIT TRANSFERRING HIGH VOLTAGE

(71) Applicant: SK hynix Inc., Gyeonggi-do (KR)

(72) Inventors: Yeonghun Lee, Gyeonggi-do (KR); Hyun Heo, Seoul (KR); Min Gyu Koo, Gyeonggi-do (KR); Dong Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/477,593

(22) Filed: Sep. 4, 2014

(65) Prior Publication Data

US 2015/0288283 A1    Oct. 8, 2015

(30) Foreign Application Priority Data

Apr. 2, 2014    (KR) .................... 10-2014-0039501

(51) Int. Cl.
    *H02M 3/158*    (2006.01)
    *G11C 16/30*    (2006.01)
    *G11C 16/08*    (2006.01)
    *G11C 16/04*    (2006.01)

(52) U.S. Cl.
CPC .............. *H02M 3/158* (2013.01); *G11C 16/08* (2013.01); *G11C 16/30* (2013.01); *G11C 16/0483* (2013.01)

(58) Field of Classification Search
CPC ..................... G11C 16/0483; G11C 16/08
USPC ............ 365/185.11, 185.17, 185.23, 185.13
See application file for complete search history.

(56) References Cited

U.S. PATENT DOCUMENTS

| | | | |
|---|---|---|---|
| 7,433,236 B2* | 10/2008 | Ha | G11O 5/145 365/185.18 |
| 2005/0265109 A1* | 12/2005 | Goda et al. | 365/230.06 |
| 2007/0047312 A1* | 3/2007 | Aritome | G11C 16/0483 365/185.17 |
| 2007/0268774 A1* | 11/2007 | Lee et al. | 365/230.06 |
| 2007/0278555 A1* | 12/2007 | Nakagawa et al. | 257/314 |
| 2009/0244968 A1 | 10/2009 | Maejima | |
| 2012/0155143 A1* | 6/2012 | Choi | G11C 8/08 365/72 |

* cited by examiner

*Primary Examiner* — Alexander Sofocleous
*Assistant Examiner* — Alfredo Bermudez Lozada
(74) *Attorney, Agent, or Firm* — IP & T Group LLP

(57) ABSTRACT

A semiconductor apparatus includes a voltage supply circuit suitable for outputting a high voltage, a transfer circuit coupled between the voltage supply circuit and a peripheral circuit and suitable for transferring the high voltage to the peripheral circuit and a transfer control circuit suitable for outputting a transfer control signal to the transfer circuit to control the transfer of the high voltage to the peripheral circuit, wherein the transfer control circuit outputs the transfer control signal having a first positive voltage level to a gate of a transistor included in the transfer circuit when the voltage supply circuit outputs the high voltage to the transfer circuit.

13 Claims, 5 Drawing Sheets

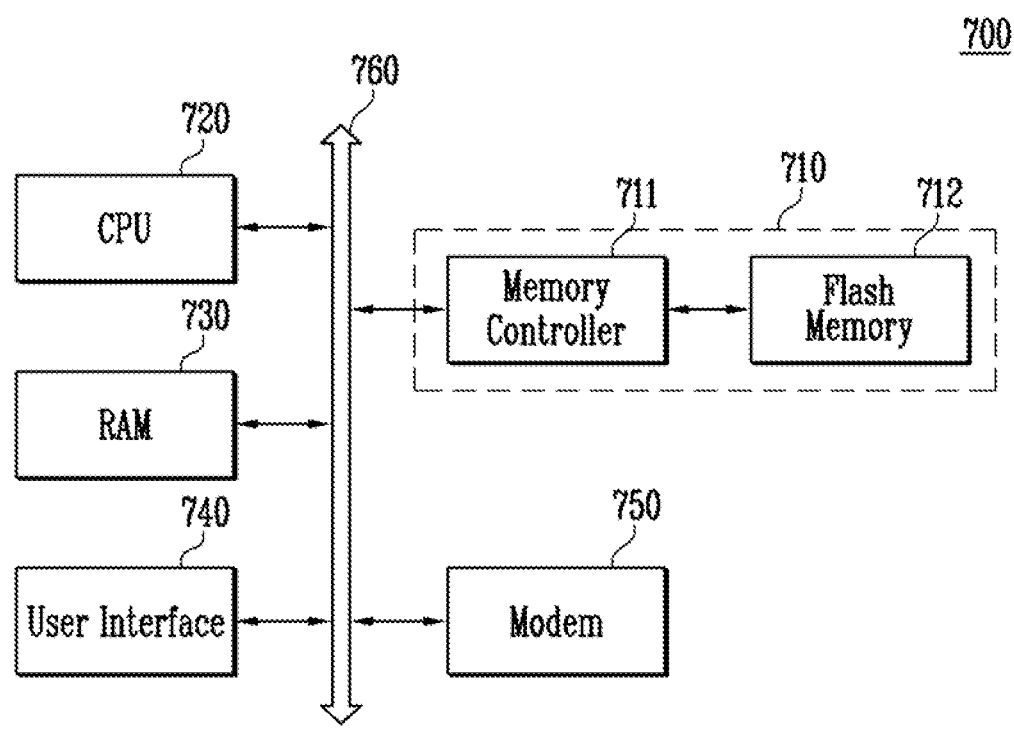

SEMICONDUCTOR APPARATUS HAVING TRANSFER CIRCUIT TRANSFERRING HIGH VOLTAGE

CROSS-REFERENCE TO RELATED APPLICATION

The present application claims priority to Korean patent application No. 10-2014-0039501, filed on Apr. 2, 2014, the entire disclosure of which is incorporated by reference herein.

BACKGROUND

1. Field of the Invention

Various embodiments of the present invention relate to an electronic device and, more particularly, to a semiconductor apparatus.

2. Description of the Related Art

Although semiconductor supply voltage levels are decreasing, high voltages are still being generated and used inside semiconductor devices. Additionally, the size of semiconductor device components continues to decrease as the devices become more highly integrated. As devices are put into use, the electrical characteristics of the device may degrade over time. This is especially true when using high voltages in highly integrated devices. Therefore, it is always a goal of the semiconductor industry to develop technologies that will maintain electrical characteristics over time in highly integrated and high voltage environments.

SUMMARY

Various embodiments of the present invention are directed to a semiconductor apparatus capable of improving electrical characteristics at high voltages.

An embodiment of the present invention provides a semiconductor apparatus including a voltage supply circuit suitable for outputting a high voltage, a transfer circuit coupled between the voltage supply circuit and a peripheral circuit and suitable for transferring the high voltage to the peripheral circuit, and a transfer control circuit suitable for outputting a transfer control signal to the transfer circuit to control transfer of the high voltage to the peripheral circuit, wherein the transfer control circuit outputs the transfer control signal having a first positive voltage level to a gate of a transistor included in the transfer circuit in a section where the voltage supply circuit outputs the high voltage to the transfer circuit.

An embodiment of the present invention provides semiconductor apparatus including memory blocks having memory cells, a voltage supply circuit suitable for outputting operating voltages to global lines, transfer circuits coupled between the global lines and local lines of the memory blocks and suitable for transferring the operating voltages to the local lines, and a transfer control circuit suitable for outputting a non-transfer decision signal and a transfer decision signal to the transfer circuits to transfer the operating voltages to the local lines of a selected memory block among the memory blocks, wherein the transfer control circuit outputs the non-transfer decision signal having a first positive voltage level to gates of transistors, which are included in the transfer circuit corresponding to a non-selected memory block among the memory blocks and coupled to the global lines.

An embodiment of the present invention provides a flash memory including memory blocks including memory cells, a voltage supply circuit suitable for outputting a program voltage and a pass voltage to global word lines, transfer transistors each coupled between the global word lines and local word lines of the memory blocks and suitable for transferring the program voltage and the pass voltage to the local word lines, and a transfer control circuit suitable for outputting decision signals to gates of the transfer transistors. When a program operation is performed, the transfer control circuit outputs the decision signal having a positive voltage level higher than a ground level, to transfer the pass voltage to a non-selected memory block among the memory blocks.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 7 is a block diagram illustrating a computing system including a flash memory according to an embodiment of the present invention.

DETAILED DESCRIPTION OF EMBODIMENTS

Figure 1:
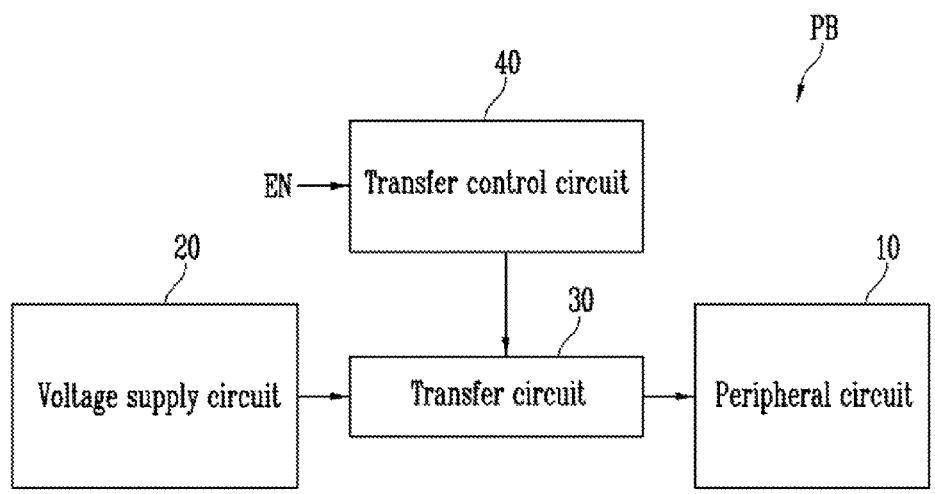
FIGS. 1 and 2 are diagrams illustrating a semiconductor apparatus according to an embodiment of the present invention.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. Throughout the disclosure, like reference numerals refer to like parts throughout the various figures and embodiments of the present invention.

In the drawings, the thicknesses and length of components are exaggerated compared to the actual physical thickness and length for convenience of illustration. In the following description, a detailed explanation of known related functions and constitutions may be omitted to avoid unnecessarily obscuring the subject manner of the present invention. Throughout this specification, when an element is referred to as being "coupled" or "connected" to another element, the element can be "directly coupled" or "directly connected" to the other element or "indirectly coupled" or "indirectly connected" to the other element with other intervening element(s). Throughout this specification, when a certain part "includes" a certain component, it does not exclude cases in which other components are included unless otherwise defined.

Figure 2:
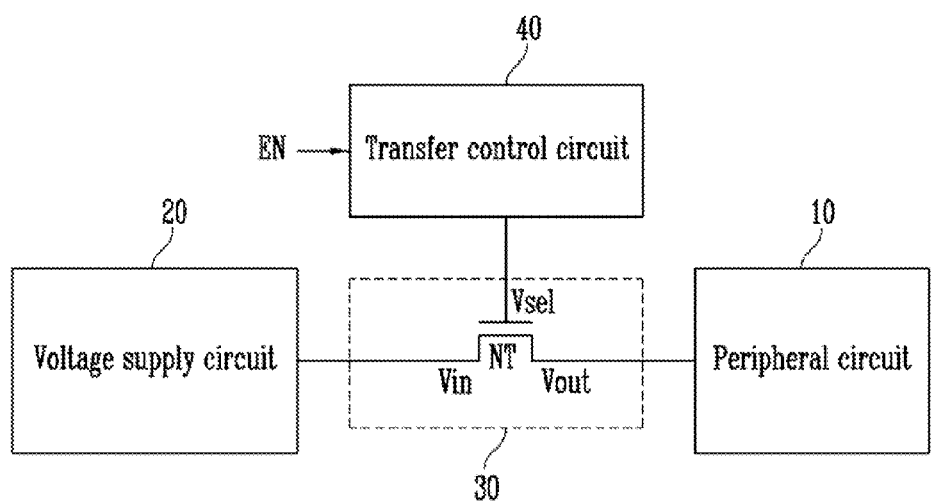

FIGS. 1 and 2 are diagrams illustrating a semiconductor apparatus according to an embodiment of the present invention.

Referring to FIGS. 1 and 2, the semiconductor apparatus may include a peripheral circuit 10, a voltage supply circuit 20, a transfer circuit 30 and a transfer control circuit 40. The peripheral circuit 10 may include circuits performing predetermined operations using a high voltage Vin. The voltage supply circuit 20 may generate the high voltage Vin. The voltage supply circuit 20 may include a charge pumping circuit.

The transfer circuit 30 may be coupled between the voltage supply circuit 20 and the peripheral circuit 10 and may transfer the high voltage Vin output from the voltage supply circuit 20 to the peripheral circuit 10. The transfer circuit 30 may include a transistor NT in which the high voltage Vin of the voltage supply circuit 20 is supplied to a drain. The transistor NT may include a high voltage NMOS transistor. For example, the transistor NT is coupled between an output terminal of the voltage supply circuit 20, from which the high voltage Vin is output, and an input terminal of the peripheral circuit 10.

The transfer control circuit 40 may output a transfer control signal Vsel to the transfer circuit 30 to control transfer of the high voltage Vin to the peripheral circuit 10. In order for a high voltage Vout, which is transferred to the peripheral circuit 30, to maintain the same level as the high voltage Vin without a voltage drop, the transfer control circuit 40 may output the transfer control signal Vsel having a level higher than the high voltage Vin to the transfer circuit 30. For example, the transfer control circuit 40 may preferably output the transfer control signal Vsel having a second positive voltage level higher than the high voltage Vin by at least a threshold voltage of the transistor NT to transfer the high voltage Vin to the peripheral circuit 10 in a section in which the voltage supply circuit 20 outputs the high voltage Vin to the transfer circuit 30.

Particularly, when the voltage supply circuit 20 is blocked from transferring the high voltage Vin in a section in which the high voltage Vin is output to the transfer circuit 30, the transfer control circuit 40 may output the transfer control signal Vsel having a voltage level capable of blocking an operation of the transfer circuit 30. For example, the transfer control circuit 40 may output the transfer control signal Vsel having a ground level, and the transfer control signal Vsel having the ground level may be supplied to a gate of the transistor NT included in the transfer circuit 30. Here, since the high voltage Vin is supplied to the drain of the transistor NT, the voltage difference between the gate and the drain of the transistor NT becomes greater. If the voltage difference between the gate and the drain is significant, a breakdown phenomenon may occur in the transistor NT.

To prevent such phenomenon from occurring, the transfer control circuit 40 may output a transfer control signal Vsel having a first positive voltage level to the transfer circuit 30 instead a ground voltage. Here, the first positive voltage level may be lower than the second positive voltage level. In a section in which the voltage supply circuit 20 outputs a high voltage Vin to the transfer circuit 30, the transfer circuit 30, by using the transfer control signal Vsel having the first positive voltage level, may block the high voltage Vin from being transferred to the peripheral circuit 10 or may transfer a limited voltage, which is low enough that operations of the peripheral circuit 10 is not affected, to the peripheral circuit 10. For example, the first positive voltage level may have a range where the transistor NT is turned off or slightly turned on so that the operation of the peripheral circuit 10 is not affected. Even if the transistor NT of the transfer circuit 30 is slightly turned on by the transfer control signal Vsel having the first positive voltage level that is as high as possible, the transistor NT may transfer a limited voltage (e.g., a voltage lower than the second positive voltage level by a threshold voltage (Vth) of the transistor NT) which is lower than the high voltage Vin to the peripheral circuit 10.

The voltage difference between the gate and the drain of the transistor NT may be reduced below the voltage difference that occurs when the transfer control signal Vsel has a ground voltage by the amount of the first positive voltage level. Accordingly, the breakdown characteristics of the transistor NT may be improved. Since the physical stability of the transistor NT has been increased by manipulating the voltages, the size of the transistor NT may be reduced without harming its function. Therefore, the degree of integration of the semiconductor apparatus may be improved.

Meanwhile, in a section where the high voltage Vin is not output to the transfer circuit 30 from the transfer supply circuit 20 and a connection between the output terminal of the voltage supply circuit 20 and the input terminal of the peripheral circuit 10 is blocked the transfer control circuit 40 may output a transfer control signal Vsel having the ground level (ground voltage level). The transfer control circuit 40 may output the transfer control signal Vsel having the first positive voltage level, the second positive voltage level or the ground level in response to an enable signal EN. The enable signal EN may be a multi-bit signal.

Figure 3:
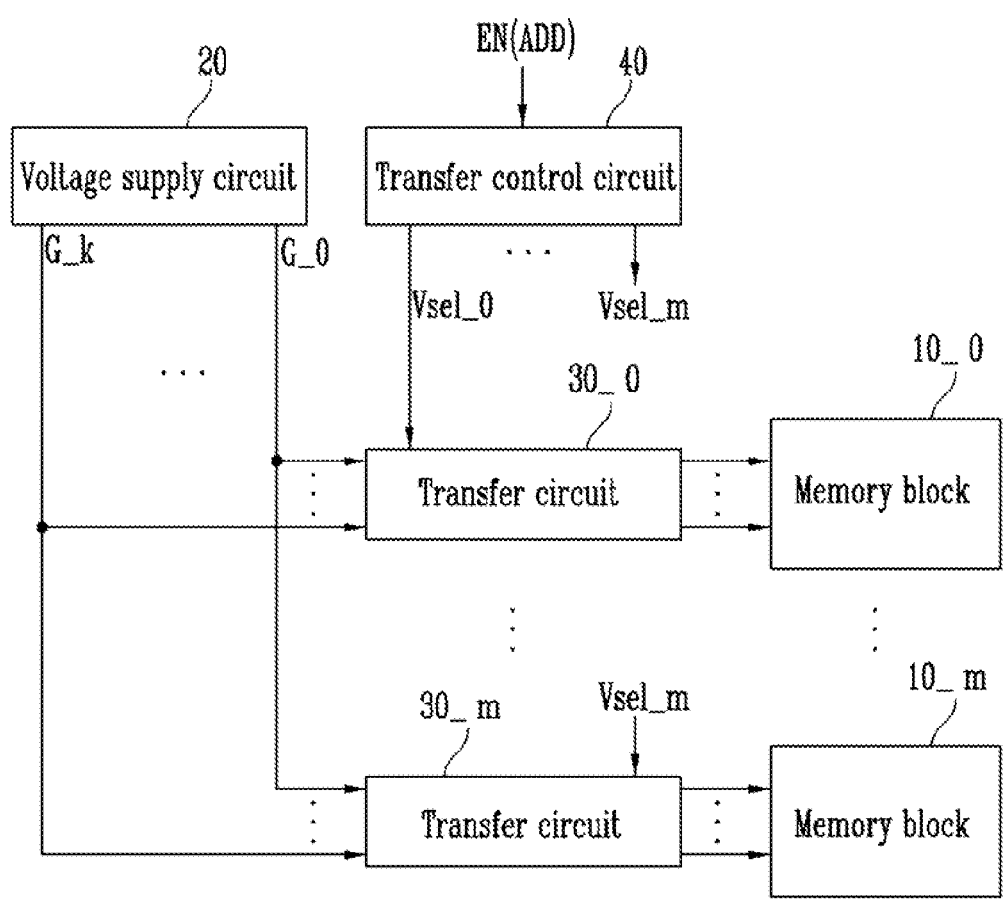
FIGS. 3 and 4 are diagrams illustrating a semiconductor apparatus according to an embodiment of the present invention.
Figure 4:
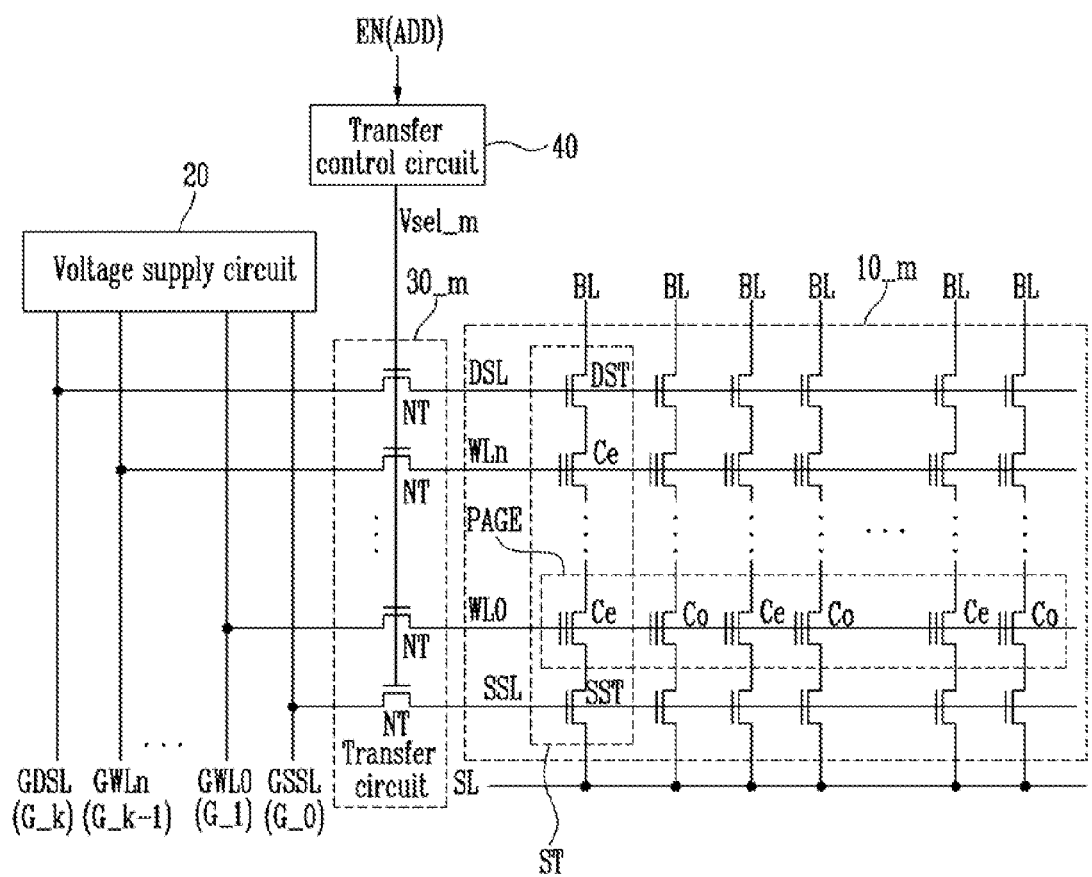

FIGS. 3 and 4 are diagrams illustrating a semiconductor apparatus according to an embodiment of the present invention.

Referring to FIGS. 3 and 4, the semiconductor apparatus may include memory blocks 10_0 through 10_m a voltage supply circuit 20, transfer circuits 30_0 through 30_m and a transfer control circuit 40.

The memory blocks 10_0 through 10_m may include DRAM cells, SRAM cells, NAND flash memory cells or other memory cells. In a case of a NAND flash memory, the memory block may be configured as follows.

The memory block 10_m may include a plurality of memory strings ST coupled between bit lines BL and a common source line SL. Memory cells Ce, Co are coupled to each of word lines WL0 through WLn. The memory strings ST may be respectively coupled to the bit lines BL and coupled in common to the common source line SL. Each of the memory strings ST may include a source select transistor SST in which a source is coupled to the common source line SL, a cell string in which a plurality of memory cells Ce are connected in series and a drain select transistor DST in which a drain is coupled to the bit line BL. The memory cells Ce that are included in the cell string are coupled between the select transistors SST, DST.

A gate of the source select transistor SST is coupled to a source select line SSL, gates of the memory cells Ce, Co are coupled to each of the word lines WL0 through WLn, and a gate of the drain select transistor DST is coupled to a drain select line DSL. Here, the drain select transistor DST may control connection or blockage between a cell string Ce and the bit line, and the source select transistor SST may control connection or blockage between the cell string Ce and the common source line SL.

In the NAND flash memory, memory cells or flag cells included in a memory cell block may be divided in units of physical or logical pages. For example, the cells Ce, Co coupled to one word line (e.g., WL0) make up one physical page PAGE. Furthermore, even-numbered cells Ce coupled to one word line (e.g., WL0) may form an even-numbered page, and odd-numbered cells Co may form an odd-numbered page. Such pages (i.e., an even-numbered page or an odd-numbered page) may be a base unit for a program operation or a read operation.

The voltage supply circuit 20 may output an operating voltage to an output terminal (or the transfer circuits 30_0 through 30_m). For example, the voltage supply circuit 20 may output operating voltages used for the program operation, the read operation and an erase operation of the memory cells to global lines GSSL, GWL0 through GWLn, GDSL.

The transfer circuits 30_0 through 30_m are respectively coupled between the global lines GSSL, GWL0 through GWLn, GDSL and local lines SSL, WL0 through WLn, DSL of the memory blocks 10_0 through 10_m and operate in response to the decision signals Vsel_0 through Vsel_m of the transfer control circuit 40. That is, the transfer circuits 30_0 through 30_m may selectively couple the global lines GSSL, GWL0 through GWLn, GDSL to the local lines SSL, WL0 through WLn, DSL the selected memory block 10_m in response to the decision signals Vsel_0 through Vsel_m to transfer the operating voltages (e.g., program voltage, an erase voltage, a read voltage, a pass voltage, a verification voltage, etc.) that are output to the global lines GSSL, GWL0 through GWLn, GDSL from the voltage supply circuit 20 to the local lines SSL, WL0 through WLn, DSL of the selected memory block 10_m.

Each of the transfer circuits 30_0 through 30_m may include the transistors NT respectively coupled between the global lines GSSL, GWL0 through GWLn, GDSL and the local lines SSL, WL0 through WLn, DSL of the respective memory block. High level operating voltages are supplied to the drain of the transistors NT, and one of the decision signals Vsel_0 through Vsel_m of the transfer control circuit 40 may be supplied to the gates.

Specifically, in a NAND flash memory, the transfer circuits 30_0 through 30_m may be provided in each of the memory blocks 10_0 through 10_m. The transfer circuits 30_0 through 30_m may selectively operate in response to the decision signals Vsel_0 through Vsel_m of the transfer control circuit 40. For example, only one transfer circuit selected from the transfer circuits 30_0 through 30_m based on the decision signals Vsel_0 through Vsel_m may selectively operate.

The transfer control circuit 40 may output the decision signals Vsel_0 through Vsel_m to the transfer circuits 30_0 through 30_m, respectively, in response to a control signal EN such as a decoded address signal ADD. Some of the decision signals Vsel_0 through Vsel_m may be transfer decision signals and the others may be non-transfer decision signals. For example, only one decision signal Vsel_0 among the decision signals Vsel_0 through Vsel_m may be the transfer decision signal, and the others Vsel_1 through Vsel_m may be the non-transfer decision signals. The transfer circuit 30_0 to which the transfer decision signal Vsel_0 is input may transfer the operating voltages output to the global lines GSSL, GWL0 through GWLn, GDSL to the memory block 10_0 without any voltage drop. Depending on a voltage of the non-transfer decision signal Vsel_m, the transfer circuits 30_m may be turned off and not transfer the operating voltages output to the global lines GSSL, GWL0 through GWLn, GDSL to the memory block 10_m, or may be slightly turned on and transfer a voltage lower than the operating voltage to the memory block 10_m so that an operation of the memory block 10_m is not affected.

If the first memory block 10_0 is selected by the decoded address signal ADD, the decision signal Vsel_0 may be the transfer decision signal among the decision signals Vsel_0 through Vsel_m output from the transfer control circuit 40, and the remaining decision signals Vsel_1 through Vsel_m may be the non-transfer decision signals. Additionally, only the transfer circuit 30_0 to which the transfer decision signal Vsel_0 is supplied may operate in a normal manner, and the transfer circuit 30_m to which the non-transfer decision signal Vsel_m is supplied may transfer the operating voltages with voltage drop. As a result, the operating voltages of the global lines GSSL, GWL0 through GWLn, GDSL may be transferred to the local lines SSL, WL0 through WLn, DSL of the memory block 10_0 selected by the transfer circuit 30_0 without any voltage drop in a normal manner. Such operation may be identical to operations of the transfer circuit 30 and the transfer control circuit 40 described in FIG. 2.

The transfer control circuit 40 may output the transfer decision signal Vsel_0 having a higher level than the operating voltage to the transfer circuit 30_0 to maintain a level of the operating voltage transferred to the local lines SSL, WL0 through WLn, DSL of the selected memory block 10_0 the same as the level of the operating voltages of the global lines GSSL, GWL0 through GWLn, GDSL without any voltage drop. For example, it may be preferable for the transfer control circuit 40 to output the transfer decision signal Vsel_0 having a second positive voltage level higher than the operating voltage by at least a threshold voltage of the transistor NT in order to transfer the operating voltage to the selected memory block 10_0 in a section in which the voltage supply circuit 20 outputs the operating voltage (e.g., a program voltage) to the global lines GSSL, GWL0 through GWLn, GDSL.

Specifically the transfer control circuit 40 may output the non-transfer decision signals Vsel_1 through Vsel_m as the ground level. The non-transfer decision signals Vsel_1 through Vsel_m having the ground level may be supplied to the gates of the transistors NT that are included in the transfer circuits 30_1 through 30_m of the non-selected memory blocks 10_1 through 10_m. Here, since high-level operating voltages are supplied to the drains of the transistors NT, the voltage difference between the gate and the drain may increase. If the voltage difference between the gate and the drain becomes significant, a breakdown phenomenon may occur in the transistors NT.

To prevent such phenomenon from occurring, the transfer control circuit 40 may output the non-transfer decision signal Vsel_m having a first positive voltage level to the transfer circuits 30_m instead of the non-transfer decision signal Vsel_m having the ground level. As such, the transfer control circuit 40 may output all of the decision signals Vsel_0 through Vsel_m having positive voltage levels. However, the positive voltage level of the non-transfer decision signal Vsel_m may be higher than the positive voltage level of the transfer decision signal Vsel_0.

For example, in a section in which the voltage supply circuit 20 outputs the operating voltages to the transfer circuits 30_0 through 30_m, the transfer circuit 30_0 may block the operating voltage from being transferred to the memory block 10_m or may transfer to the memory block 10_m a voltage that is low enough so that the operation of the memory block 10_m is not affected by the non-transfer control signal Vsel_m having a positive voltage level.

For example, the transfer control circuit 40 may output the non-transfer control signal Vsel_m having a positive voltage level so that the transistors NT of the transfer circuit 30_m are turned off or output the non-transfer control signal Vsel_m having a positive voltage level that is as high as possible so that the operation of the memory block 10_m is not affected. Even if the transistors NT of the transfer circuit 30_m is slightly turned on due to the transfer control signal Vsel_m having the positive voltage level as high as possible, the transistors NT may transfer a voltage lower than the operating voltage (e.g., a pass voltage Vpass supplied to non-selected word lines) to the memory block 10_m. The transferred voltage may have a voltage level corresponding to 'Vdummy−Vth', where Vth is a threshold voltage of the transistor NT and Vdummy is the same as or lower than the pass voltage Vpass.

TABLE 1

|  | Decision signals | Global lines | Local lines |
|---|---|---|---|
| Transfer circuit 30_0 | Vsel_0 = Vpgm + Vt | Vpgm Vpass | Vpgm Vpass |
| Transfer circuit 30_m | Vsel_m = Vdummy | Vpgm Vpass | Vdummy − Vth (<Vpass) Vdummy − Vth (<Vpass) |

As shown in Table 1 above, the transfer decision signal Vsel_0 having a second positive voltage level (Vpgm+Vt; the sum of the program voltage and the threshold voltage) may be supplied to the transfer circuit 30_0 of the selected memory block 10_0. As a result, the operating voltages (e.g., the program voltage Vpgm and the pass voltage Vpass) of the global lines GSSL, GWL0 through GWLn, GDSL may be transferred to the local lines SSL, WL0 through WLn, DSL of the selected memory block 10_0 without any voltage drop through the transfer circuit 30_0.

The non-transfer decision signal Vsel_m having a first positive voltage level Vdummy may be supplied to the transfer circuit 30_m of the non-selected memory block 10_m. The first positive voltage level Vdummy of the non-transfer decision signal Vsel_m may be the same as or lower than the pass voltage Vpass applied to non-selected global word lines among the global lines GSSL, GWL0 through GWLn, GDSL when the program operation is performed. As a result, the non-selected transfer circuit 30_m may transfer voltages lower than the operating voltages of the global lines GSSL, GWL0 through GWLn, GDSL (e.g., 'Vdummy−Vth') to the local lines SSL, WL0 through WLn DSL of the non-selected memory block 10_m. The voltage 'Vdummy−Vth' transferred to the local lines SSL, WL0 through WLn, DSL of the non-selected memory block 10_m may be low enough so that the tunneling phenomenon does not occur in the memory cells included in the non-selected memory block 10_m. That is, even if the voltage 'Vdummy−Vth' is supplied to the local lines SSL, WL0 through WLn, DSL of the non-selected memory block 10_m the memory cells of the non-selected memory block 10_m may not be programmed.

The voltage difference between the gate and the drain of the transistors NT that are included in the non-selected transfer circuit 30_m may be lower than the voltage difference therebetween when the non-transfer control signal Vsel_m having the ground level is supplied by the first positive voltage level Vdummy. As a result, the breakdown characteristics of the transistor NT may be improved. Since the size of the transistors NT may be reduced as much as the breakdown characteristics of the transistors NT are improved, the degree of integration for the semiconductor apparatus may be enhanced.

The non-transfer decision signals having the first positive voltage level may be output only if the operating voltage of the global lines GSSL, GWL0 through GWLn, GDSL is high (e.g., in a case of the program operation), and the transfer control circuit 40 may output the non-transfer decision signals having the ground level if the operating voltage is not high (e.g., in a case of the read operation or the erase operation). As such, the transfer control circuit 40 may output the decision signals Vsel_0 through Vsel_m with the first positive voltage level, the second positive voltage level or the ground level.

Figure 5:
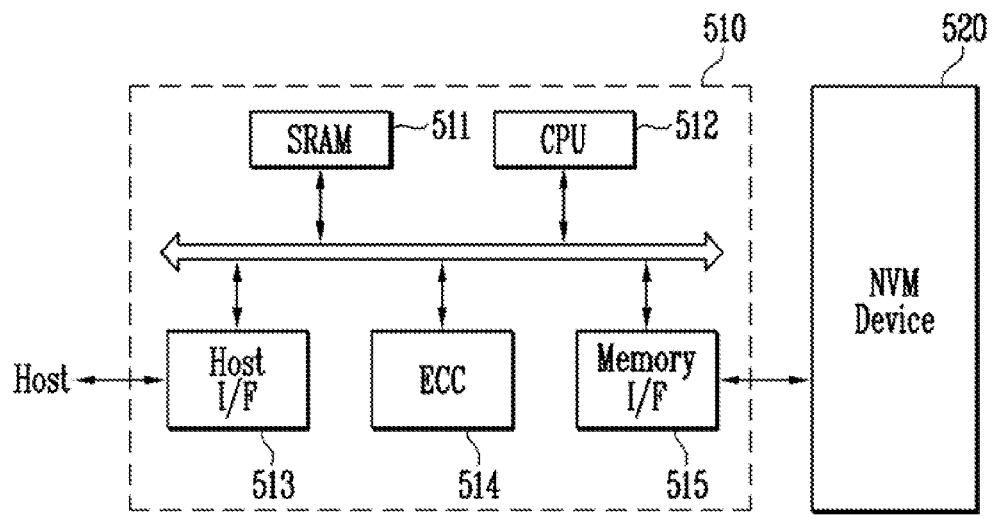
FIG. 5 is a block diagram illustrating a memory system according to an embodiment of the present invention.

FIG. 5 is a block diagram illustrating a memory system according to an embodiment of the present invention.

Referring to FIG. 5, the memory system 500 according to an embodiment may include a non-volatile memory device 520 and a memory controller 510.

The non-volatile memory device 520 may include the semiconductor apparatus described in FIG. 1 or 3. The memory controller 510 may control the non-volatile memory device 520. The operating properties of the memory system 500 may be improved depending on whether the non-volatile memory device 520 of the memory system 500 includes the semiconductor apparatus as described above.

A memory card or a semiconductor disk device, for example, a solid-state disk (SSD), may be manufactured as a result of combination of the non-volatile memory device 520 and the memory controller 510. SRAM 511 may be used as an operating memory of a processing unit 512. A host interface 513 may have a data exchange protocol for the host connected to the memory system 500. An error correction block 514 may detect and correct an error included in data read from the non-volatile memory device 520. A memory interface 515 may interface with the non-volatile memory device 520. The processing unit 512 may perform all control operations for data exchange of the memory controller 510.

Although not shown in the figures, it would be obvious to a person of ordinary skill in the art that ROM (not shown) for storing code data for interfacing with the host Host, etc. may be further provided to the memory system 500. The non-volatile memory device 520 may be provided as a multi-chip package comprising a plurality of flash memory chips. The system 500 may be provided as a highly reliable storage medium with a low probability of an error occurring. Specifically, the flash memory may be provided in a memory system such as the semiconductor disk device (e.g., an SSD). Here, the memory controller 510 may communicate with the outside through one of various interface protocols such as USB, MMC, PCI-E, SATA, PATA, SCSI, ESDI, IDE, etc.

Figure 6:
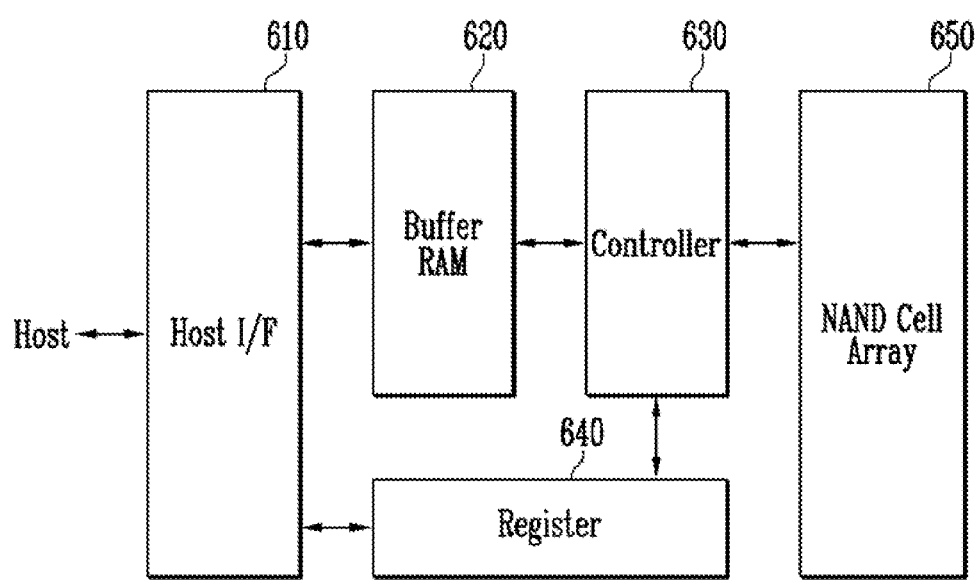
FIG. 6 is a block diagram illustrating a fusion memory device or a fusion memory system performing an operation according to an embodiment of the present invention.

FIG. 6 is a block diagram illustrating a fusion memory device or a fusion memory system performing an operation according to an embodiment of the present invention. For example, the features of the semiconductor apparatus described above may be applied to the a NAND flash memory 600 as a fusion memory device.

The one NAND flash memory 600 may include a host interface 610 for exchanging various information with a device using different protocols, a buffer ram 620 for internally storing code for driving a memory device or for temporarily storing data, or a controller 630 for controlling reading, programs, and all states in response to a control signal and a command provided from an outside (e.g. an outside source), a register 640 for storing data such as configurations, etc. defining a system operating environment inside the memory device, and a NAND flash cell array 650 configured as an operating circuit including a non-volatile memory cell and a read/write circuit.

FIG. 7 is a block diagram illustrating a computing system including a flash memory according to an embodiment of the present invention.

The computing system 700 may include a microprocessor 720 electrically coupled to a system bus 760, a RAM 730, a user interface 740, a modern 750 such as a baseband chipset, and a memory system 710. If the computing system 700 is a mobile device, a battery (not shown) may be additionally provided to supply an operating voltage of the computing system 700. Although not shown in the figures, it would be obvious to a person of ordinary skill in the art that an application chipset, a camera image processor, a mobile DRAM, etc. may be further provided to the computing system 700. The memory system 710, for example, may include an SSD which uses the semiconductor apparatus described above for storing data. Or, the memory system 710 may be provided as a fusion flash memory (for example, a one-NAND flash memory).

In the drawings and specification exemplary embodiments of the invention have been disclosed, and although specific terms are employed, they are intended to be used in a generic and descriptive sense only and not for purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A semiconductor apparatus, comprising:
    a voltage supply circuit configured to output a high voltage to global line of a non-selected memory block;
    a transfer circuit configured to be coupled between the global line of the non-selected memory block and local line of the non-selected memory block and to transfer the high voltage to the local line of the non-selected memory block; and
    a transfer control circuit configured to output a transfer control signal to the transfer circuit for controlling transfer of the high voltage to the local lines of the non-selected memory block,
    wherein the transfer circuit include a pass transistors in which the high voltage is supplied to a drain of the pass transistor and the transfer control signal is supplied to a gate of the pass transistor,
    the transfer control signal has a first positive voltage level which is lower than a pass voltage supplied to a selected memory block when a program operation is performed, and
    wherein the transfer control signal has a ground level when a read operation or an erase operation is performed.

2. The semiconductor apparatus of claim 1, wherein the transfer control circuit outputs the transfer control signal having a second positive voltage level that is higher than the high voltage by a threshold voltage of the transistor when the high voltage of the voltage supply circuit is transferred to the transfer circuit.

3. The semiconductor apparatus of claim 2, wherein the second positive voltage level is higher than the first positive voltage level.

4. The semiconductor apparatus of claim 1, wherein the transfer control circuit outputs a transfer control signal having the first positive voltage level as high as possible to an extent in which operation of the peripheral circuit is not affected.

5. A semiconductor apparatus, comprising:
    memory blocks including memory cells;
    a voltage supply circuit configured to output operating voltages to global lines;
    a plurality of transfer circuits configured to be coupled between the global lines and local lines of the memory blocks, respectively and to transfer the operating voltages to the local lines; and
    a transfer control circuit configured to output a non-transfer decision signal and a transfer decision signal to the plurality of the transfer circuits to transfer the operating voltages to the local lines of a selected memory block among the memory blocks,
    wherein the transfer control circuit outputs the non-transfer decision signal having a first positive voltage level to gates of transistors, which are included in the transfer circuit corresponding to a non-selected memory block among the memory blocks and coupled to the global lines,
    the first positive voltage level of the non-transfer decision signal is lower than a pass voltage supplied to the selected memory block during a program operation, and
    wherein the transfer control circuit outputs the non-transfer decision signal having the first positive voltage level when a program operation is performed and outputs the non-transfer decision signal having a ground level when a read operation or an erase operation is performed.

6. The semiconductor apparatus of claim 5, wherein the transfer control circuit outputs the non-transfer decision signal having the first positive voltage level to the transfer circuit corresponding to the non-selected memory block.

7. The semiconductor apparatus of claim 5, wherein the transfer control circuit outputs the non-transfer decision signal having the first positive voltage level to the transfer circuit corresponding to the non-selected memory block to block the transfer of the operating voltage to the local lines of the non-selected memory block.

8. The semiconductor apparatus of claim 5, wherein the transfer control circuit outputs the non-transfer decision signal having the first positive voltage level so that the transistors included in the transfer circuit corresponding to the non-selected memory block are slightly turned on.

9. The semiconductor apparatus of claim 5, wherein the voltage supply circuit outputs a program voltage and the pass voltage when the program operation for storing data into the memory cells is performed.

10. The semiconductor apparatus of claim 5, wherein the transfer control circuit outputs the transfer decision signal having a second positive voltage level higher than the operating voltage by a threshold voltage of the transistors to the gates of the transistors included in the transfer circuit corresponding to the selected memory block.

11. The semiconductor apparatus of claim 10, wherein the voltage supply circuit outputs the transfer decision signal having the second positive voltage level to transfer the operating voltage when the voltage supply circuit outputs the operating voltage to the global lines.

12. The semiconductor apparatus of claim 10, wherein the second positive voltage level is higher than the first positive voltage level.

13. The semiconductor apparatus of claim 10, wherein the operating voltage includes a program voltage.

* * * * *